United States Patent [19]
Horn, III et al.

[11] Patent Number: 5,922,453
[45] Date of Patent: Jul. 13, 1999

[54] CERAMIC-FILLED FLUOROPOLYMER COMPOSITE CONTAINING POLYMERIC POWDER FOR HIGH FREQUENCY CIRCUIT SUBSTRATES

[75] Inventors: Allen F. Horn, III, Danielson; Richard R. Traskos; David A. Allen, both of Brooklyn, all of Conn.

[73] Assignee: Rogers Corporation, Rogers, Conn.

[21] Appl. No.: 08/795,857

[22] Filed: Feb. 6, 1997

[51] Int. Cl.$^6$ .......................... B32B 27/04; B32B 27/06; B32B 27/20; B32B 27/28
[52] U.S. Cl. ................ 428/325; 428/1; 428/323; 428/327; 428/328; 428/330; 428/331; 428/421; 428/422; 428/457; 428/901
[58] Field of Search ...................... 428/323, 325, 428/327, 328, 329, 330, 331, 421, 422, 457, 901, 1

[56] References Cited

U.S. PATENT DOCUMENTS

| | | | |
|---|---|---|---|
| 4,194,040 | 3/1980 | Breton et al. | 428/308 |
| 4,335,180 | 6/1982 | Traut | 428/303 |
| 4,849,284 | 7/1989 | Arthur et al. | 428/325 |
| 4,980,232 | 12/1990 | Prevorsek et al. | 425/401 |
| 4,985,190 | 1/1991 | Ishikawa et al. | 264/122 |
| 4,996,097 | 2/1991 | Fischer et al. | 428/220 |
| 5,104,599 | 4/1992 | Prevorsek et al. | 264/140 |
| 5,225,489 | 7/1993 | Prevorsek et al. | 525/151 |
| 5,274,878 | 1/1994 | Yamakawa et al. | 428/306.6 |
| 5,358,775 | 10/1994 | Horn, III | 428/209 |
| 5,506,049 | 4/1996 | Swei et al. | 428/323 |

*Primary Examiner*—Vivian Chen
*Attorney, Agent, or Firm*—Cantor Colburn LLP

[57] ABSTRACT

A ceramic-filled fluoropolymer composite is presented, suitable for use as an electrical substrate material. In accordance with the present invention, a ceramic-filled fluoropolymer composite further comprises high temperature, high modulus, finely powdered polymeric material. The median particle size of the finely powdered polymeric material is less than about 200 $\mu$m. The finely powdered polymeric material is further stable at temperatures greater than about 350° C. Substitution of the finely powdered polymeric material for fluoropolymer matrix material within a fairly narrow concentration range results in a composite with enhanced flexural modulus, but no deleterious effect on dielectric loss. The composite material is plated or clad with conductive material.

31 Claims, 1 Drawing Sheet

CERAMIC-FILLED FLUOROPOLYMER COMPOSITE CONTAINING POLYMERIC POWDER FOR HIGH FREQUENCY CIRCUIT SUBSTRATES

BACKGROUND OF THE INVENTION

1. Field of the Invention

This invention relates generally to filled fluoropolymeric composites. More particularly, this invention relates to ceramic-filled fluoropolymeric composites for use as electrical substrate materials, comprising high temperature, high modulus polymeric powders. The substrate material exhibits a high flexural modulus, as well as good dimensional stability. Such substrate materials are especially useful as laminates for manufacturing microwave circuits.

2. Brief Description of the Prior Art

Fluoropolymer (predominantly PTFE) matrix composites are widely used as substrates in the microwave frequency circuit board industry. PTFE composites have excellent electrical properties, high temperature resistance, and outstanding solvent resistance. Many of the general types of fluoropolymeric circuit board substrates are described in "Specification for Plastic Substrates, Clad or Unclad for High Speed/High Frequency Interconnections" (Document IPC-L-125). The eight general types are described in sections IPC-L-125/01 to IPC-L-125/08.

Fluoropolymer substrate types 1 to 5 are composites of PTFE and glass fiber. Types 1, 2 and 5 are reinforced with woven glass fabric, while types 3 and 4 are reinforced with non-woven E-glass fibers. PTFE/glass fiber composites are low dielectric constant (K') materials, with the dielectric constant ranging from 2.15 to 2.65. These types of materials exhibit a relatively high flexural modulus due to the glass fiber reinforcement, but are limited in the range of dielectric constants achievable (K' less than about 3.0). Furthermore, these materials often exhibit a comparatively high dielectric loss, due to the loss properties of the glass fabric. Most of these materials also exhibit a comparatively high z-axis coefficient of thermal expansion (CTE) (greater than 100 ppm/°C.) since the glass fabric provides reinforcement predominantly only in the XY plane.

Fluoropolymer substrate types 6, 7, and 8 are PTFE composites filled with ceramic powder in order to alter the dielectric properties of the substrate. The dielectric constant of these types of materials can be tailored over a comparatively wide range by varying the type of ceramic filler. Comparatively low dielectric loss may be obtained through use of low loss fillers such as fused amorphous silica. It is also possible to make low z-axis CTE (less than 50 ppm/°C.) circuit substrates, since the ceramic filler reduces the CTE of the composite more isotropically than glass fabric. Low z-axis CTE is desirable since it improves the reliability of plated through hole connections if the boards are subjected to thermal cycling.

Examples of these ceramic powder-filled composites include Rogers Corporation's RO3000® product line. This is a family of low dielectric loss silica/titania powder-filled PTFE composite microwave circuit substrates, available with dielectric constants of 3.0, 6.15, and 10.2. The RO3000® products also exhibit excellent dimensional stability (DimStab) and low z-axis CTE independent of dielectric constant, since the total filler contents are approximately the same. The differing dielectric constants are achieved by varying the ratio of silica to titania filler. These composite materials are described in commonly-assigned application No. 08/283,302, the disclosure of which in herein incorporated by reference in its entirety.

Other ceramic-filled composites have been described in U.S. Pat. No. 4,996,097 to Fischer. Fischer generally discloses a PTFE matrix with from 25 to 85 volume percent particulate filler and an optional organic polymeric thermoset resin to lower lamination temperatures and improve adhesion of the film. U.S. Pat. No. 5,545,475 to Korleski discloses a microfiber-reinforced porous polymer film and method of manufacture. The microfibers are produced by the addition of liquid crystalline polymer (LCP) powder to PTFE, paste extrusion, calendering, and then stretching the resulting sheet at high temperature to stretch the LCP particles into fibrils. Neither of these aforementioned patents address the problem of increasing the flexural modulus of particulate-filled fluoropolymer composites.

While these materials are suitable for the various uses for which they are intended, among circuit board processors accustomed to flexurally stiff woven glass reinforced materials, there is a perceived need for ceramic powder-filled materials stiffer than those currently available. The "high flexibility" (low flexural modulus) of these type 6, 7, and 8 materials can lead to difficulties in material handling, particularly with conveyorized equipment designed to operate with glass fabric reinforced circuit substrates, and particularly at laminate thicknesses of less than about 0.020".

SUMMARY OF THE INVENTION

The above-discussed and other drawbacks and deficiencies of the prior art are overcome or alleviated by the ceramic-filled fluoropolymer composite of the present invention. In accordance with the present invention, a ceramic-filled fluoropolymer composite further comprises high temperature, high modulus finely powdered polymeric material. The median particle size of the high temperature polymeric material is less than about 200 $\mu$m, and is stable at temperatures greater than about 350° C.

Substitution of these polymeric powders for fluoropolymer matrix material within certain fairly narrow ranges of concentration results in an increase in the modulus by nearly an order of magnitude, with only a minor increase in dielectric loss, and no deleterious effects on the other advantageous properties associated with ceramic powder-filled PTFE composites.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DETAILED DESCRIPTION OF THE INVENTION

Figure 1:
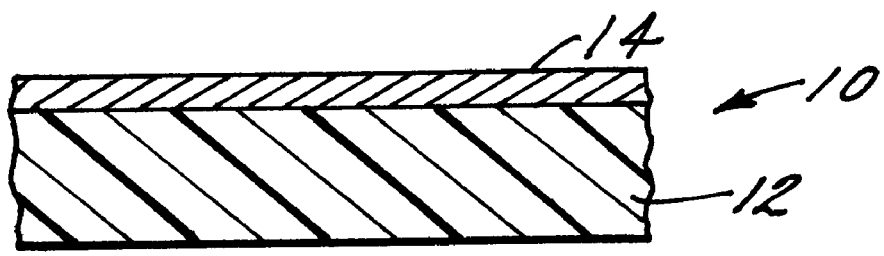
FIG. 1 is a cross-sectional elevational view of an electrical substrate laminate according to the present invention that is clad with a conductive metal on one side.

The ceramic-filled fluoropolymer composite according to the present invention comprises a fluoropolymer matrix, at least one ceramic particulate material, and a high temperature, high modulus, finely powdered polymeric material. By "high temperature" is meant that the material is stable above about 350° C. By "high modulus" is meant that the material is rigid, exhibiting a flexural modulus of greater than about 200,000 psi. The median particle size of the high temperature, high modulus polymeric material is less than or equal to about 200 μm. Furthermore, the high temperature, high modulus polymeric material must also exhibit certain properties in order to be useful to in increasing the modulus of ceramic powder-filled fluoropolymer composite.

Firstly, the polymer powder cannot degrade at the high temperatures (greater than 350° C.) required to melt and form fluoropolymer composite circuit substrates. There are a number of rigid high temperature polymeric materials that withstand processing temperatures of greater than about 350° C., including liquid crystalline polymers (LCP), poly (etherimide) polymers (PEI), poly(ethersulfone) polymers, thermoplastic and thermoset polyimides, poly(ketone) polymers, poly(ether ether ketone) (PEEK) polymers, poly (phenylenesulfide) polymers, and polysulfones.

Secondly, the rigid polymeric material must be either available in fine powder or fiber form, or renderable to such a state. PEEK, for example, is an engineering thermoplastic commercially available as a fine powder. The process used to manufacture PEEK results in a powder that is easily reduced in particle size to the desired range. Other engineering thermoplastics not commonly sold as fine powder are amenable to cryogenic grinding. For example, XYDAR® liquid crystalline polyester can be hammermilled at the temperature of liquid nitrogen to a particle size distribution appropriate for use in the present invention. ULTEM®, a poly(etherimide) has also been cryogenically hammermilled to an appropriate particle size distribution. VECTRA®, another liquid crystalline polyester, can also be cryogenically hammermilled to a fine fiber state appropriate for use in the instant invention.

Effective use of the polymeric powders is restricted to a fairly narrow range of concentrations. As shown in the Examples below, the polymeric powders are preferably substituted for fluoropolymer matrix material when added to composites of known composition. Thus, the polymeric powder may be present in a range from about 2 to about 30 volume % of the total composite. Preferably, the polymeric powder is present in a range from about 5 to about 20 volume % of the total composite.

The fluoropolymeric matrix is most preferably polytetrafluoroethylene (PTFE), but may also comprise one or a combination of the following fluoropolymers: a copolymer of tetrafluoroethylene and perfluoroalkyl vinyl ether (PFA), a copolymer of hexafluoropropylene and tetrafluoroethylene (FEP), and poly(ethylene-co-tetrafluoroethylene). Preferably, the fluoropolymeric matrix is present in an amount of between about 5 to about 40 volume % of the total composite.

The filler type and the amount of filler is selected depending upon the desired electrical and dimensional stability properties of the composite material. Although it should be understood that the dielectric filler can be selected from any of a number of known dielectric materials, examples of preferred fillers include titanium dioxide (rutile and anatase), barium titanate, strontium titanate, silica (particles and hollow spheres), including fused amorphous silica and micro-crystalline silica, corundum, wollastonite, polytetrafluoroethylene, aramide fibers (e.g., KEVLAR), fiberglass, $Ba_2Ti_9O_{20}$, glass spheres, quartz, boron nitride, aluminum nitride, silicon carbide, beryllia, or magnesia. They may be used alone or in combination. Preferably, the total amount of filler is in the range from about 40 to about 65 volume % of the total composite.

As discussed in detail in the commonly assigned application 08/283,302, independent control of the dielectric constant and dimensional stability of the circuit substrate can be achieved with a blend of two or more ceramic fillers.

In general, one of the two fillers will be at least one high dielectric constant filler having a dielectric constant of greater than about 30. The second filler may have any dielectric constant. However, in a preferred embodiment, the second filler comprises at least one low dielectric constant filler having a dielectric constant of less than about 30. Other properties of the fillers are also important to yield a useful microwave substrate. The fillers should both exhibit a relatively low dielectric loss (<0.005) at frequencies greater than 400 MHz. The particle size distribution and particle morphology should be such that the composite has a relatively low (less than about 10 volume %) porosity as measured by uptake of a low surface tension solvent such as xylene. The particles themselves must also not exhibit significant porosity in order to make a low porosity composite.

Certain types of titania filler such as Tionia®, manufactured by SCM Corporation, meet these requirements and provide a good high dielectric constant filler. Other suitable high dielectric constant fillers include $SiTiO_3$, $CaTiO_3$ and $BaTiO_4$. Fused amorphous silica, such as Minsil-20, manufactured by Minsil, Inc. or FB-35, manufactured by Denki Kagaku Kogyo, K.K. (DENKA) are examples of good low dielectric constant fillers. Other siliceous materials such as micro-crystalline silica or glass beads may equally well be used as low dielectric constant fillers. Still other suitable second (which may or may not be low dielectric constant fillers) include $Al_2O_3$, MgO and $Ba_2Ti_9O_{20}$.

In the preferred embodiment of the invention, the at least one ceramic filler is treated with a hydrophobic coating to improve the water absorption, ductility and copper bond strength of the fluoropolymeric composite material. Examples of efficacious and known hydrophobic coatings are silane coupling agents, titanates and zirconates.

A number of methods may be used to apply the hydrophobic coating to the ceramic filler(s). The fillers may be "pre-treated" as described by Arthur et al. in U.S. Pat. No. 4,849,284. The hydrophobic coating may also be introduced to the filler-PTFE mixture with the hydrocarbon lubricant as described in S.N. 08/099,245, now U.S. Pat. No. 5,358,775. The hydrophobic coating may also be introduced in the aqueous mixture of fillers and PTFE dispersion in the casting process. All of these processes have been practically demonstrated to improve the water absorption, ductility and copper peel strength over that of composites made with untreated filler.

The fluoropolymeric composite material may be fabricated by any of a number of methods previously described in both the patent and open literature. One fabrication process is essentially the same as the manufacturing process taught by Traut in U.S. Pat. No. 4,335,180, which is assigned to the assignee hereof and incorporated herein by reference. The process taught by Traut involves the dispersion of the ceramic filler and glass microfiber in water, the addition of fluoropolymer resin in dispersion form and the co-flocculation of the resin, filler and fiber. The present invention, however, does not require the incorporation of glass microfiber. The co-flocculated material is then lubricated with a hydrocarbon lubricant and formed into a sheet by paste extrusion and calendering. The content of hydrocarbon lubricant may vary from about 14% to 25% by weight, depending on the specific gravity, PSD, and morphology of the ceramic fillers.

A second fabrication process eliminates the use of water as a dispersant. In this "dry-blending" process, taught by Horn in S.N. 08/099,245, now U.S. Pat. 5,358,775, assigned to the assignee hereof and incorporated herein by reference, PTFE "fine powder" resin is blended with the ceramic fillers in a mixing device such as a Patterson Kelly Vee Blender along with the hydrocarbon lubricant and then formed into a sheet by paste extrusion and calendering.

A third fabrication process, taught by Swei et al in U.S. Pat. 5,312,576, assigned to the assignee hereof and incorporated herein by reference, causes the fillers and PTFE dispersion to be mixed and the viscosity increased with a viscosifying agent. The thickened mixture is then cast upon a carrier sheet and dried in an oven. The viscosifying agent is removed thermally and the composite material is sintered in a high temperature oven and released from the carrier sheet. This process is particularly well suited for the production of thin (less than 0.005") sheets.

Figure 2:
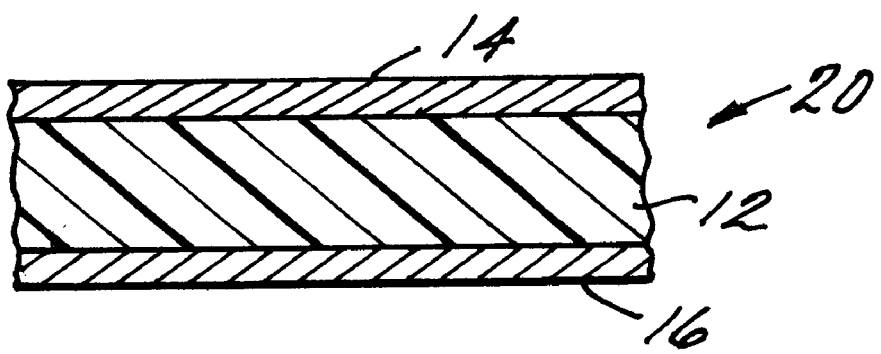
FIG. 2 is a cross-sectional elevational view of an electrical substrate laminate according to the present invention that is clad with a conductive metal on both sides.

Referring to FIG. 1, the filled fluoropolymeric composite in accordance with the present invention is shown in the form of a circuit board 10, wherein the composite 12 comprises a dielectric sheet clad on one side with a conductive sheet 14, which is preferably a metal sheet such as copper or aluminum. Referring to FIG. 2, the filled fluoropolymeric composite in accordance with the present invention is shown in the form of a circuit board 20, wherein the composite 12 comprises a dielectric sheet clad between conductive sheets 14, 16, which are preferably metal sheets such as copper or aluminum.

EXAMPLES

The following non-limiting examples demonstrate that the modulus of ceramic-filled fluoropolymer composite circuit substrates can be substantially increased without significant deleterious effect on their desirable properties by the addition of high temperature, high modulus, fine polymeric powders. The examples also demonstrate the fairly narrow range of polymeric powder concentrations over which the modulus can be increased without a deleterious effect on other composite properties.

It is furthermore unexpectedly shown that in some cases the addition of the rigid polymeric powder to the fluoropolymer composite results in a composite material with a higher modulus than that of either the rigid polymeric powder or the PTFE composite alone. There is evidently some previously unknown interaction between the thermoplastic material and the composite that results in a modulus which is higher than that of either component. "Rules of mixture" for predicting the modulus of particulate-filled composites always predict values that are intermediate of the two components. See, L. E. Neilsen & Robert F. Landel, *Mechanical Properties of Polymers and Composites,* Second Edition, Chapter 7, Marcel Dekker, Inc., N.Y., 1994.

EXAMPLE 1 Increasing the Modulus of Rogers' RO3003® with PEEK

Poly(ether ether ketone) (PEEK) is a high temperature engineering thermoplastic that is exclusively distributed in the United States by Victrex, U.S.A. PEEK exhibits a melting point of 644° F., a tensile modulus of about 522,000 psi and a flexural modulus of 594,500 psi according to the data sheet. A fine particle grade (Victrex 150XF) is available from Victrex U.S.A. This material exhibits a median particle size of about 20 $\mu$m, with 90% less than 44 $\mu$m and 10% less than 9 $\mu$m as measured by a Horiba LA-900 laster light scattering particle size analyzer.

The volume fractions are calculated on a "void-free" basis. These void-free volumes are calculated based on the theoretical specifc gravity of the composite, i.e., the additive values of the specific gravites of each of the components. The formulations of six experimental PEEK-containing materials are shown on a volume and weight basis in Table 1. The standard RO3003® formulation contains 44.5 volume % PTFE and 55.5 volume % filler. Samples 10039-18, 19, 20 and 28, formulated with a constant 55.5 volume % ceramic filler, contained 5, 10, 20 and 30 volume % PEEK substituted for PTFE, respectively. Samples 10039-21 and 22, formulated with a constant 44.5 volume % PTFE, had 5 and 10 volume % PEEK substituted for the filler.

In the present examples, the target dielectric constant of the samples was 3.0, with a desired dimensional stability of less than 1 mil/inch of change when tested by the IPC-TM-650 method. Based on previous experimentation described in application 08/283,302 it was known that the total volume content of filler would be greater than about 50 volume % to achieve the desired dimensional stability. Also based on experiments described in the same application, it was known that a mixture of silica and titania, with about 2 volume % of the total composite comprised of titania, would result in the desired dielectric constant of 3.0. Thus, in all cases of examples 1–3, the "filler" refers to a mixture of silica and titania, titania being present in the amount of 2 volume % of the total composite. If higher dielectric constant materials were desired, one would simply increase the proportion of the high dielectric filler (in this case, titania) relative to the low dielectric filler. As described in application 08/283,302, composites with a filler comprised of about 50 volume % titania, 10 volume % silica, and 40 volume % PTFE result in composites having a dielectric constant of about 10.5.

TABLE 1

| | Formulations for PEEK-Rigidized RO3003 ® | | | | | |
|---|---|---|---|---|---|---|
| Sample | Vol. % PEEK | Vol. % PTFE | Vol. % Filler | Wt. % PEEK | Wt. % PTFE | Wt. % Filler |
| RO3003 | — | 44.5 | 55.5 | — | 43.9 | 56.1 |
| 10039-18 | 5.0 | 39.5 | 55.5 | 2.9 | 39.7 | 57.4 |
| 10039-19 | 10.0 | 34.5 | 55.5 | 6.0 | 35.4 | 58.6 |
| 10039-20 | 20.0 | 24.5 | 55.5 | 12.5 | 26.3 | 61.2 |
| 10039-28 | 30.0 | 14.5 | 55.5 | 19.6 | 16.3 | 64.1 |
| 10039-21 | 5.0 | 44.5 | 50.5 | 2.9 | 44.7 | 52.4 |
| 10039-22 | 10.0 | 44.5 | 45.5 | 6.0 | 45.6 | 48.4 |

The components were mixed and processed using a 50 volume % total solids casting mixture according to the procedures disclosed in U.S. Pat. No. 5,312,576 to Swei, the disclosure of which is herein incorporated by reference in it entirety. All sheets were post-baked before lamination at 550° F. for 8 hours to remove the volatile components of the PTFE dispersion.

The postbaked sheets were laminated to 1 oz. Gould Corporation G2-B copper using a 760° F. cycle with a 20 minute dwell. 0.060" laminates were made for electrical, CTE, and flex property testing and 0.020" laminates were used for specific gravity, water, and xylene absorption, copper peel strength, and DimStab testing. Due to the limited amount of material, DimStab and copper peel strength testing was not performed on sample 10039-28. Specific gravity, xylene and water absorption measurements were made on the 0.060" material. The data in Table 2 show that solids and surfactant contents were as expected and sheet volatiles were acceptable. The measured ash contents were within 0.7% of the desired values.

TABLE 2

Manufacturing Data for PEEK-Rigidized RO3003 ®

| Sample | Input Wt. % Filler | Surfactant Content | Mix Solids % | Ash Content | Sheet Volatile % |
|---|---|---|---|---|---|
| 10039-18 | 57.4 | 3.38% | 68.55 | 57.65% | 0.035/0.043 |
| 10039-19 | 58.6 | 3.20% | 68.55 | 59.25% | 0.042/0.046 |
| 10039-20 | 61.2 | 2.86% | 67.61 | 61.16% | 0.049/0.052 |
| 10039-28 | 64.1 | — | — | 63.96% | — |
| 10039-21 | 52.4 | 3.45% | 68.64 | 52.69% | 0.039/0.042 |
| 10039-22 | 48.4 | 3.49% | 68.32 | 48.67% | 0.046/0.057 |

Flex and Tensile Properties

As shown in Table 3, a significant increase in the flex properties of RO3003® can be achieved by the substitution of PEEK powder for PTFE. The flexural modulus was measured using a three-point bending apparatus in accordance with ASTM method D790–92. Unmodified RO3003® exhibits a flex modulus of about 100,000 psi and a yield strength of 1100–1300 psi. By comparison, an 0.020" thick sample of Rogers Corporation Ultralam® woven glass Teflon laminate was about ten times greater in both properties. The substitution of 20 vol.% PEEK for PTFE in accordance with the present invention increased the flex modulus by a factor of 3 to 4, and more than doubled the yield stress. The 30% PEEK sample exhibited a flex modulus of 800,000 psi and yield stress of 4400 psi.

It is surprising that the addition of PEEK to the PTFE-silica composite increases the composite modulus to a value greater than the PEEK itself As mentioned above, there is evidently a heretofore unknown interaction between the thermoplastic material and the composite, which results in a modulus higher than the modulus of either component, as "rules of mixture" for predicting the modulus of particulate-filled composites always predict values that are intermediate of the two components The substitution of PEEK for filler also increased modulus and yield strength of the composite substrates. Both the 5 and 10 vol.% PEEK samples showed about twice the modulus of unmodified RO3003®.

TABLE 3

Flex Property Comparison for PEEK-Rigidized RO3003

| Sample | Vol. % PEEK/Filler | Flexural modulus (psi) | Yield stress (psi) |
|---|---|---|---|
| RO3003 | — | 94–124 × $10^3$ | 1100–1300 |
| Ultralam ®* | — | 1.06 × $10^6$ | 10,600 |

TABLE 3-continued

Flex Property Comparison for PEEK-Rigidized RO3003

| Sample | Vol. % PEEK/Filler | Flexural modulus (psi) | Yield stress (psi) |
|---|---|---|---|
| 10039-18 | 5.0/55.5 | 166–234 × $10^3$ | 1350 |
| 10039-19 | 10.0/55.5 | 166–218 × $10^3$ | 1338–1726 |
| 10039-20 | 20.0/55.5 | 307–399 × $10^3$ | 1843–2702 |
| 10039-28 | 30.0/55.5 | 806 × $10^3$ | 4446 |
| 10039-21 | 5.0/50.5 | 156–280 × $10^3$ | 1315–1643 |
| 10039-22 | 10.0/45.5 | 183–194 × $10^3$ | 1525–1783 |

*0.020" thick sample, all others approx. 0.060"

Samples 10039-18,-19,-20, and -21 were also tested for tensile properties: As shown by the data in Table 4, substitution of PEEK in place of the ceramic filler has a lesser effect. All five samples exhibited tensile moduli of 12–15× $10^3$ psi, apparently irrespective of PEEK content. In the case of PEEK substitution for PTFE, the maximum stress and maximum elongation also decrease with increasing PEEK content. In the case of PEEK substitution for filler, both maximum stress and maximum elongation increase a little with increasing PEEK. However, since laminate stiffness is related to flexural, and not tensile modulus, the lack of a substantial increase in tensile modulus is not a significant drawback to the invention.

TABLE 4

Tensile Properties of PEEK-Rigidized RO3003 ®

| Sample | Vol. % PEEK/Filler | Tensile modulus (psi) | Maximum stress (psi) | Elongation % |
|---|---|---|---|---|
| 10039-18 | 5.0/55.5 | 15.0 × $10^3$ | 926 | 85.7 |
| 10039-19 | 10.0/55.5 | 12.7 × $10^3$ | 914 | 55.5 |
| 10039-20 | 20.0/55.5 | 12.1 × $10^3$ | 654 | 7.9 |
| 10039-28 | 30.0/55.5 | — | — | — |
| 10039-21 | 5.0/50.5 | 13.1 × $10^3$ | 960 | 164.7 |
| 10039-22 | 10.0/45.5 | 14.3 × $10^3$ | 1049 | 169.1 |

Laminate Properties

Except for an increase in tanδ values, the substitution of PEEK for PTFE does not a have any particularly deleterious effect on laminate properties (Table 5). Copper peel strengths ranged from 4 to 6.3 pli for the materials formulated in accordance with the present invention.

Dimensional stability (DimStab) is a measure of the movement of fiducial marks on the substrate once the copper is fully removed by chemical etching. Dimensional stability is an important property of a circuit substrate and standard tests are recommended by the Institute for Printed Circuits Test Methods manual (IPC-TM-650 2.2.4B and IPC-TM-650 2.4.39A). It is highly desirable that the circuit substrate exhibit a dimensional change as measured by these tests of less than 1 mil/inch.

As shown in Table 5, DimStab was not significantly affected by the substitution of PEEK for PTFE. However, the substitution of PEEK for filler significantly increased the material's CTE. The addition of 10 volume % PEEK in place of the silica filler (sample 10039-22) resulted in a DimStab of about −2.5 mil/inch. Thus, when adding a rigid polymeric material to a PTFE composite substrate, the rigid polymer must be added in place of PTFE rather than filler to avoid a deleterious affect to dimensional stability. This demonstrates the narrow concentration range over which a high temperature rigid polymers can be added to a PTFE composite circuit substrate without adversely affecting other desirable properties.

The substitution of 10 volume % PEEK for silica filler also resulted in an increase in the coefficient of thermal expansion from 23.5 to 37 ppm/°C., when measured over the temperature range of –55 to +125° C. Low CTE is desirable for good plated through hole reliability.

At frequencies of about 1 GHz, PTFE is one of the lowest loss, commercially available polymers, typically exhibiting a tan$\delta$ of about 0.0003. Known high temperature rigid polymeric materials have high values of tan$\delta$, particularly at high frequencies. PEEK, for example, is listed by its manufacturer as having a tan$\delta$ of 0.003–0.004 at 1–10 GHz. It is therefore important that the addition of such rigid polymeric materials not result in substantial degradation in the desirable low loss of the PTFE composite substrate.

Accordingly, K" and tan$\delta$ were measured on 0.060" samples using the "long stripline" (LSL) resonance method described by Traut (G. R. Traut, "Electrical Performance of Microwave Boards," *IEEE Transaction of Components, Packaging and Manufacturing Technology*, Part B, Vol. 18, No. 1, Feb. 1995). The values at approximately 10 GHz are reported in Table 5. The sample of RO3003® material yielded a dielectric constant of 2.95 and a tan$\delta$ value of 0.0013. Substituting PEEK for PTFE caused an increase in both K" and tan$\delta$, because the K" and tan$\delta$ of PEEK are high than those of PTFE. The 20 volume % PEEK sample exhibited a tan$\delta$ of 0.0016, about 25% higher than RO3003®, while the 30 volume % PEEK material exhibited a tan$\delta$ of 0.0023. These data demonstrate that in order to retain the desirable low tan$\delta$ of the PTFE ceramic composite substrate, the PEEK content should be no greater than about 30 vol.%.

EXAMPLE 2 Increasing the Modulus of Rogers RO3003® with XYDAR® LCP polyester

XYDAR® liquid crystalline polymer (LCP) polyester is commercially available from Amoco Performance Polymers. XYDAR LCP exhibits a processing temperature of about 735° F. and a flexural modulus of 2×10$^6$ psi. Because of its high temperature compatibility and high modulus, it is well suited for addition to PTFE composite to increase the composite modulus.

XYDAR® LCP is generally sold in pelletized form for extrusion and injection molding applications. In order to render the material into fine powder form, the pellets were cooled by immersion in liquid nitrogen. The chilled pellets were then fed to a hammermill and reduced to powder of a median particle size of about 100 $\mu$m as measured on a Horiba LA-900.

The substrate materials were prepared by the methods described in Example 1 using the formulations listed in Table 6. Flexural modulus, dielectric constant, tan$\delta$, dimensional stability and water absorption were measured as in Example 1.

TABLE 6

Formulations for XYDAR ® LCP-Rigidized RO3003 ®

| Sample | Vol. % XYDAR ® | Vol. % PTFE | Vol. % Filler | Wt. % XYDAR ® | Wt. % PTFE | Wt. % Filler |
|---|---|---|---|---|---|---|
| 10039-56 | 10.0 | 34.5 | 55.5 | 6.3 | 35.3 | 58.4 |
| 10039-57 | 20.0 | 24.5 | 55.5 | 13.2 | 26.0 | 60.8 |
| 10039-58 | 30.0 | 14.5 | 55.5 | 20.6 | 16.1 | 63.3 |

As shown in Table 7, the addition of XYDAR® LCP resulted in substantial increases in the flex modulus of the PTFE composite material. Sample 10039-58 showed a greater than four-fold increase in flex modulus.

TABLE 5

Laminate Properties for PEEK-Rigidized RI3003 ®

| | | | | | LSL 10 GHz | |
|---|---|---|---|---|---|---|
| Sample | Vol. % PEEK/FILLER | H$_2$O Abs. D23/24 | Xylene Abs. Vol. % | Cu bond pli | K' | tan$\delta$ |
| 10039-18 | 5.0/55.5 | 0.20% | 5.6% | 5.5 | 2.91 | 0.0013 |
| 10039-19 | 10.0/55.5 | 0.37% | 6.6% | 5.3 | 3.04 | 0.0014 |
| 10039-20 | 20.0/55.5 | 0.36% | 5.2% | 4.0 | 3.15 | 0.0016 |
| 10039-28 | 30.0/55.5 | 0.21% | 4.9% | — | 3.33 | 0.0023 |
| 10039-21 | 5.0/50.5 | 0.19% | 4.9% | 4.0 | 2.90 | 0.0014 |
| 10039-22 | 10.0/45.5 | 0.24% | 4.0% | 6.3 | 3.05 | 0.0013 |

| | | Z-axis | | | |
|---|---|---|---|---|---|
| | Vol. % | Coeff. of Thermal Expansion | | Dimensional Change | |
| Sample | PEEK/FILLER | –55 to +125° C. | –55 to +288° C. | MD-mil/in | CMD-mil/in |
| 10039-18 | 5.0/55.5 | 23.5 ppm/C | 30.2 ppm/C | +0.05 | +0.06 |
| 10039-19 | 10.0/55.5 | 26.3 ppm/C | 30.7 ppm/C | +0.51 | +0.71 |
| 10039-20 | 20.0/55.5 | 28.7 ppm/C | — | +0.07 | +0.03 |
| 10039-28 | 30.0/55.5 | — | — | — | — |
| 10039-21 | 5.0/50.5 | 30.7 ppm/C | 40.9 ppm/C | –0.74 | –1.18 |
| 10039-22 | 10.0/45.5 | 37.0 ppm/C | 48.9 ppm/C | –2.21 | –2.75 |

TABLE 7

Flex Property Comparison for XYDAR ® LCP-Rigidized RO3003 ®

| Sample | Vol. % XYDAR/Filler | Flexural modulus (psi) |
| --- | --- | --- |
| 10039-56 | 10.0/55.5 | 172.9 × 10³ |
| 10039-57 | 20.0/55.5 | 214.3 × 10³ |
| 10039-58 | 30.0/55.5 | 438.3 × 10³ |

As shown in Table 8, the addition of the XYDAR® LCP resulted in no significant deterioration of other desirable laminate properties. Tanδ values for the sample containing the highest loading of XYDAR® LCP (10039-58, 30 volume %) increased by only 0.0003 over the RO3003® control. As in the Example 1, where the filler content was maintained at a constant value of 55.5 volume %, the XYDAR® LCP-stiffened composites exhibit desirable dimensional stability values of less than 1 mil/inch.

TABLE 8

Laminate Properties for XYDAR ® LCP-Rigidized RO3003 ®

| Sample | Vol. % PEEK/FILLER | H₂O Abs. D23/24 | DimStab. (mil/inch) | LSL 10 GHz K' | tanδ |
| --- | --- | --- | --- | --- | --- |
| 10039-56 | 10.0/55.5 | 0.12% | -0.7 | 3.06 | 0.0011 |
| 10039-57 | 20.0/55.5 | 0.09% | -0.2 | 3.01 | 0.0012 |
| 10039-58 | 30.0/55.5 | 0.19% | -0.5 | 3.04 | 0.0013 |

EXAMPLE 3 Rigidization of circuit substrate with poly(etherimide)

ULTEM® 1000 poly(etherimide) (PEI) is another example of a high temperature engineering thermoplastic sold by GE Plastics (General Electric Company, Pittsfield, Mass.). PEI is an amorphous material that exhibits a glass transition temperature of 419° F. and a flexural modulus of 480,000 psi according to the manufacturer's data sheet. The ULTEM® 1000 PEI was purchased in pellet form and hammermilled at liquid nitrogen temperatures and passed through a 200 mesh (74 micron opening) screen to yield a fine powder.

Sample 10039-92, consisting of 20 volume % ULTEM® 1000 PEI, 55.5 volume % ceramic filler, and 24.4 volume % PTFE composite was prepared by the method discussed in example 1. After etching of the copper cladding, this material exhibited a high flexural modulus of 896,000 psi and good dimensional stability (0.45 mil/inch).

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. An electrical substrate composite material comprising:
   a) a fluoropolymer matrix;
   b) at least one particulate ceramic filler present in amount greater than 30 volume percent of the total substrate composition; and
   c) a high temperature, high modulus, polymeric powder having a median particle size of less than or equal to 200 μm, present in an amount of between about 2 and about 30 volume percent of the total composition, wherein the composite material has a flexural modulus of greater than 200,000 psi.

2. The electrical substrate composite material of claim 1, wherein:
   the composite material has a tanδ value of less than 0.005.

3. The electrical substrate composite material of claim 1, wherein:
   the fluoropolymer matrix is selected from the group consisting of polytetrafluoroethylene, a copolymer of tetrafluoroethylene and perfluoroalkyl vinyl ether, a copolymer of hexafluoropropylene and tetrafluoroethylene, poly(ethylene-co-chlorotrifluoroethylene), poly(chlorotrifluoroethylene), poly(ethylene-co-tetrafluoroethylene), and mixtures thereof.

4. The material of claim 1, further including:
   a hydrophobic coating on said at least one particulate ceramic filler.

5. The material of claim 4 wherein:
   the coating is selected from the group consisting of silanes, titanates and zirconates.

6. The electrical substrate composite material of claim 1, wherein:
   the at least one particulate ceramic filler is selected from the group consisting of titanium dioxide, calcium titanate, barium titanate, strontium titanate, silica, corundum, wollastonite, fiberglass, Ba₂Ti₉O₂₀, glass spheres, quartz, boron nitride, aluminum nitride, silicon carbide, beryllia, magnesia, and combinations thereof.

7. The electrical substrate composite material of claim 1, wherein:
   the at least one particulate ceramic filler comprises a mixture of
   (a) at least one first ceramic material having a dielectric constant greater than 30; and
   (b) at least one second ceramic material having a dielectric constant less than 30.

8. The material of claim 7, wherein:
   the first ceramic material is selected from the group consisting of titania, strontium titanate, calcium titanate, and barium titanate.

9. The electrical substrate composite material of claim 7, wherein:
   the second ceramic material is selected from the group consisting of fused amorphous silica, micro-crystalline silica, glass beads, alumina, magnesium oxide, and Ba₂Ti₉O₂₀.

10. The electrical substrate composite material of claim 7, wherein:
    the particulate ceramic filler is present in an amount of about 50 to 60 volume % and further wherein the first ceramic filler comprises titania and the second ceramic filler comprises silica.

11. The electrical substrate composite material of claim 1 wherein:
    the at least one particulate filler material exhibits a dielectric of loss of less than 0.005 at frequencies greater than 500 MHZ.

12. The electrical substrate composite material of claim 1, wherein:
    the high temperature, high modulus polymeric powder is selected from the group consisting of liquid crystalline polymers, poly(etherimide) polymers, poly(ethersulfone) polymers, thermoplastic and thermoset polyimides, poly(ketone) polymers, poly(ether ether ketone) polymers, poly(phenylenesulfide) polymers, polysulfones, and mixtures thereof.

13. The electrical substrate composite material of claim 12 wherein:

the high temperature, high modulus polymeric powder is selected from the group consisting of liquid crystalline polymers, poly(ether ether ketone) polymers, and mixtures thereof.

14. The electrical substrate composite material of claim 1 wherein:

the fluoropolymeric matrix is present in an amount of between about 5 to 40 volume percent of the total composite material.

15. The electrical substrate composite material of claim 1 wherein:

the at least one particulate ceramic filler material is present in an amount of between about 40 to about 65 volume percent of the total substrate material.

16. The electrical substrate composite material of claim 1 wherein:

the high temperature, high modulus polymeric powder is present in an amount of between about 5 to about 30 volume percent of the total substrate material.

17. The electrical substrate composite material of claim 1, further including:

at least one metal layer on at least a portion of a surface of the composite material.

18. The electrical substrate composite material of claim 17, wherein:

the metal layer comprises copper.

19. The electrical substrate composite material of claim 17, wherein:

the composite material has a dimensional change upon etch and bake of less than 1.5 mil/inch.

20. The electrical substrate composite material of claim 17, wherein:

the composite material has a planar shape and includes and X-Y plane, and further wherein the coefficient of thermal expansion of the X-Y plane is within the range of greater than 11 ppm/°C. and less than 20 ppm/°C.

21. The electrical substrate composite material of claim 1, wherein:

the composite material has a dielectric constant in the range of about 3.0 to 20.0.

22. The electrical substrate composite material of claim 1, wherein:

the high temperature, high modulus polymeric powder is a poly(ether ether ketone) polymer present in an amount of between 5 to about 20 volume percent of the total composite material.

23. The electrical substrate composite material of claim 1, wherein:

the high temperature, high modulus polymeric powder is a liquid crystalline polymer, present in an amount of between about 5 to about 20 volume percent of the total composite material.

24. The electrical substrate composite material of claim 1, wherein:

the high temperature, high modulus, polymeric powder is poly(ether imide) present in an amount of between about 5 to about 20 volume percent of the total substrate composition.

25. An electrical substrate material comprising:

1) a composite material comprising:
    a) a fluoropolymer matrix;
    b) at least one particulate ceramic filler present in amount greater than 30 volume percent of the total substrate composition; and
    c) a high temperature, high modulus, polymeric powder having a median particle size of less than or equal to 200 $\mu$ m, present in an amount of between about 2 and about 30 volume percent of the total composition, wherein the composite material has a flexural modulus of greater than 200,000 psi; and
2) at least one layer of copper on at least a portion of a surface of the composite material.

26. The electrical substrate material of claim 25, wherein:

the fluoropolymer matrix is selected from the group consisting of polytetrafluoroethylene, a copolymer of tetrafluoroethylene and perfluoroalkyl vinyl ether, a copolymer of hexafluoropropylene and tetrafluoroethylene, poly(ethylene-co-chlorotrifluoroethylene), poly(chlorotrifluoroethylene), poly(ethylene-co-tetrafluoroethylene), and mixtures thereof.

27. The electrical substrate material of claim 25, wherein:

the at least one particulate ceramic filler is selected from the group consisting of titanium dioxide, calcium titanate, barium titanate, strontium titanate, silica, corundum, wollastonite, fiberglass, $Ba_2Ti_9O_{20}$, glass spheres, quartz, boron nitride, aluminum nitride, silicon carbide, beryllia, magnesia, and combinations thereof.

28. The electrical substrate material of claim 25, wherein:

the at least one particulate ceramic filler comprises a mixture of
    (a) at least one first ceramic material having a dielectric constant greater than 30; and
    (b) at least one second ceramic material having a dielectric constant less than 30.

29. The material of claim 28, wherein:

the first ceramic material is selected from the group consisting of titania, strontium titanate, calcium titanate, and barium titanate; and
the second ceramic material is selected from the group consisting of fused amorphous silica, micro-crystalline silica, glass beads, alumina, magnsium oxide, and $Ba_2Ti_9O_{20}$.

30. The electrical substrate material of claim 25, wherein:

the high temperature, high modulus polymeric powder is selected from the group consisting of liquid crystalline polymers, poly(etherimide) polymers, poly(ethersulfone) polymers, thermoplastic and thermoset polyimides, poly(ketone) polymers, poly(ether ether ketone) polymers, poly(phenylenesulfide) polymers, polysulfones, and mixtures thereof.

31. The electrical substrate material of claim 30, wherein:

the high temperature, high modulus polymeric powder is selected from the group consisting of liquid crystalline polymers, poly(ether ether ketone) polymers, and mixtures thereof.

* * * * *